(12) United States Patent
Lee et al.

(10) Patent No.: US 10,276,571 B2
(45) Date of Patent: Apr. 30, 2019

(54) CIRCUIT DESIGN SYSTEM AND SEMICONDUCTOR CIRCUIT DESIGNED BY USING THE SYSTEM

(71) Applicant: Samsung Electronics Co., Ltd., Suwon-si (KR)

(72) Inventors: Kyong-Taek Lee, Suwon-si (KR); Sang-Woo Pae, Seongnam-si (KR); Hye-Jin Kim, Hwaseong-si (KR); June-Kyun Park, Seongnam-si (KR); Hyun-Woo Lee, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/698,978

(22) Filed: Sep. 8, 2017

(65) Prior Publication Data

US 2018/0006034 A1    Jan. 4, 2018

Related U.S. Application Data

(63) Continuation of application No. 15/014,436, filed on Feb. 3, 2016, now abandoned.

(30) Foreign Application Priority Data

Feb. 4, 2015 (KR) .................. 10-2015-0017098

(51) Int. Cl.
| | |
|---|---|
| *G06F 17/50* | (2006.01) |
| *H01L 27/092* | (2006.01) |
| *H01L 27/088* | (2006.01) |
| *H01L 27/00* | (2006.01) |

(Continued)

(52) U.S. Cl.
CPC ...... *H01L 27/0922* (2013.01); *G06F 17/5045* (2013.01); *H01L 27/088* (2013.01); *G06F 17/505* (2013.01); *G06F 17/5022* (2013.01); *G06F 17/5081* (2013.01); *H01L 21/823462* (2013.01); *H01L 27/1104* (2013.01)

(58) Field of Classification Search
CPC ............... G06F 17/5045; G06F 17/505; G06F 17/5022; G06F 17/5081
USPC .................... 716/132, 104, 107, 136; 703/15
See application file for complete search history.

(56) References Cited

U.S. PATENT DOCUMENTS

| | | |
|---|---|---|
| 5,821,800 A | 10/1998 | Le et al. |
| 6,002,290 A | 12/1999 | Avery et al. |
| 6,222,384 B1 | 4/2001 | Kim |

(Continued)

FOREIGN PATENT DOCUMENTS

| | | |
|---|---|---|
| JP | 20090207031 | 9/2009 |
| KR | 100774893 | 11/2007 |

OTHER PUBLICATIONS

"Circuit Design System and Semiconductor Circuit Designed by Using the System" Specification, Drawings, Claims and Prosecution History of U.S. Appl. No. 15/014,436, filed Feb. 3, 2016, by Kyong-Taek Lee, et al.

*Primary Examiner* — Phallaka Kik
(74) *Attorney, Agent, or Firm* — Onello & Mello, LLP

(57) ABSTRACT

A system and method may determine the operating parameters, such as voltages, of MOS transistors within a circuit design by testing or simulation, for example and may identify a MOS transistor operating with its drain voltage higher than its gate voltage in the circuit. The design system and method may substitute a smaller transistor, having a high-k dielectric layer, for the original transistor in the circuit design.

20 Claims, 11 Drawing Sheets

(51) Int. Cl.
*H01L 27/11* (2006.01)
*H01L 21/8234* (2006.01)

(56) References Cited

U.S. PATENT DOCUMENTS

| | | |
|---|---|---|
| 6,445,622 B1 | 9/2002 | Hirano |
| 6,556,061 B1 | 4/2003 | Chen et al. |
| 6,614,283 B1 | 9/2003 | Wright et al. |
| 6,642,769 B1 | 11/2003 | Chang et al. |
| 6,700,407 B1 | 3/2004 | Wert |
| 7,375,574 B2 | 5/2008 | Kanno et al. |
| 8,313,994 B2 | 11/2012 | Clark |
| 8,344,788 B2 | 1/2013 | Yamazaki et al. |
| 8,502,317 B2 | 8/2013 | van den Berg et al. |
| 8,575,986 B2 | 11/2013 | Sumitomo |
| 8,674,738 B2 | 3/2014 | Nishijima |
| 9,373,275 B2 | 6/2016 | Chuang et al. |
| 2003/0173586 A1 | 9/2003 | Moriwaki et al. |
| 2010/0244206 A1 | 9/2010 | Bu et al. |
| 2010/0253393 A1* | 10/2010 | Yamamoto ........... G09G 3/3677 327/108 |
| 2011/0227637 A1 | 9/2011 | Stuber et al. |
| 2013/0163350 A1 | 6/2013 | Oshima |
| 2014/0027785 A1 | 1/2014 | Rose |
| 2015/0132938 A1* | 5/2015 | Ahmed ................ H01L 29/517 438/591 |
| 2016/0225769 A1* | 8/2016 | Lee .................... H01L 27/0922 |

\* cited by examiner

1200

1300

1400

CIRCUIT DESIGN SYSTEM AND SEMICONDUCTOR CIRCUIT DESIGNED BY USING THE SYSTEM

CROSS-REFERENCE TO RELATED APPLICATION

This application is a continuation of U.S. patent application Ser. No. 15/014,436, filed Feb. 3, 2016, which claims priority from Korean Patent Application No. 10-2015-0017098 filed on Feb. 4, 2015 in the Korean Intellectual Property Office, and all the benefits accruing therefrom under 35 U.S.C. 119, the contents of which in its entirety are herein incorporated by reference.

BACKGROUND

1. Field of Inventive Concepts

Inventive concepts relate to a circuit design system and a semiconductor circuit designed using the system.

2. Description of the Related Art

With a trend toward miniaturization of a semiconductor device fabrication process, there is an increasing demand for miniaturized semiconductor devices. In order to fabricate the miniaturized semiconductor devices, the number and size of semiconductor circuits may be reduced. However, the reliability of each semiconductor device or circuit could be compromised during the course of miniaturization and that should be avoided.

SUMMARY

In exemplary embodiments in accordance with principles of inventive concepts, a circuit design system uses a transistor including a high-k dielectric film for reducing an area of the transistor while maintaining product reliability.

In exemplary embodiments in accordance with principles of inventive concepts, a circuit design method uses a transistor including a high-k dielectric film for reducing an area of the transistor while maintaining product reliability.

In exemplary embodiments in accordance with principles of inventive concepts, a computer-readable recording medium includes a program for executing a circuit design method using a transistor including a high-k dielectric film for reducing an area of the transistor while maintaining product reliability.

In exemplary embodiments in accordance with principles of inventive concepts, a semiconductor circuit uses a transistor including a high-k dielectric film for reducing an area of the transistor while maintaining product reliability.

In exemplary embodiments in accordance with principles of inventive concepts, a circuit design system including a processor; a storage in which a plurality of transistor designs are stored; and a design module designing a circuit based on the plurality of transistor designs according to defined requirements by the processor, wherein the plurality of transistor designs are designs for transistors each including a gate insulating film including a high-k dielectric layer, wherein the design module analyzes a circuit design including the plurality of transistor designs, selects a first transistor design among the plurality of transistor designs, the first transistor design operating in a region where a drain voltage is higher than a gate voltage, and substitutes a second transistor design having a smaller size than the first transistor design for the selected first transistor design, wherein a second drain-gate voltage of the second transistor design operating in an accumulation mode is higher than a first drain-gate voltage of the first transistor design operating in the accumulation mode.

In exemplary embodiments in accordance with principles of inventive concepts, a circuit design method including analyzing a semiconductor circuit plurality of transistors and selecting a first NMOS transistor among the plurality of transistors, the first NMOS transistor operating in a region where a drain voltage is higher than a gate voltage; and substituting a second NMOS transistor having a smaller size than the first NMOS transistor for the first NMOS transistor, wherein the first NMOS transistor includes a gate insulating film without a high-k dielectric layer and the second NMOS transistor includes a gate insulating film with a high-k dielectric layer, and a second drain-gate voltage of the second NMOS transistor operating in an accumulation mode is higher than a first drain-gate voltage of the first NMOS transistor operating in the accumulation mode.

In exemplary embodiments in accordance with principles of inventive concepts, a computer-readable recording medium including a program for executing a circuit design method, the circuit design method including analyzing a semiconductor circuit plurality of transistors and selecting a first NMOS transistor among the plurality of transistors, the first NMOS transistor operating in a region where a drain voltage is higher than a gate voltage; and substituting a second NMOS transistor having a smaller size than the first NMOS transistor for the first NMOS transistor, wherein the first NMOS transistor includes a gate insulating film without a high-k dielectric layer and the second NMOS transistor includes a gate insulating film with a high-k dielectric layer, and a second drain-gate voltage of the second NMOS transistor operating in an accumulation mode is higher than a first drain-gate voltage of the first NMOS transistor operating in the accumulation mode.

In exemplary embodiments in accordance with principles of inventive concepts, a semiconductor circuit including a first transistor gated to an inverted voltage level of a second node and supplying a power supply voltage to a first node; a second transistor connected in parallel to the first transistor, gated to an inverted voltage level of the first node and supplying the power supply voltage to the second node; a third transistor gated to a voltage level of an input signal and supplying a ground voltage; a fourth transistor connected in series to the third transistor, gated to the power supply voltage and transferring an output of the third transistor to the first node; a fifth transistor gated to an inverted voltage level of the input signal and supplying the ground voltage; and a sixth transistor connected in series to the fifth transistor, gated to the power supply voltage and transferring an output of the fifth transistor to the second node, wherein the first to sixth transistors include gate insulating films each including a high-k dielectric layer.

In exemplary embodiments in accordance with principles of inventive concepts, a circuit design system includes a processor, a storage in which a plurality of transistor designs are stored; and a design module designing a circuit based on the plurality of transistor designs according to defined requirements by the processor, wherein the plurality of transistor designs are designs for transistors each including a gate insulating film with a high-k dielectric layer, wherein the design module analyzes a circuit design, selects a first transistor design whereby the first transistor design operates within the circuit in a region where a drain voltage is higher than a gate voltage, and substitutes a second transistor design having a smaller size than the first transistor design for the selected first transistor design, wherein a second drain-gate voltage of the second transistor design operating in an accumulation mode is higher than a first drain-gate voltage of the first transistor design operating in the accumulation mode.

In exemplary embodiments in accordance with principles of inventive concepts, the second drain-gate voltage of the second transistor design is higher than the first drain-gate voltage of the first transistor design in the accumulation mode.

In exemplary embodiments in accordance with principles of inventive concepts, an area of the second transistor design is smaller than an area of the first transistor design.

In exemplary embodiments in accordance with principles of inventive concepts, a thickness of the gate insulating film of the second transistor design is smaller than a thickness of the gate insulating film of the first transistor design.

In exemplary embodiments in accordance with principles of inventive concepts, a threshold voltage the second transistor design is lower than a threshold voltage of the first transistor design.

In exemplary embodiments in accordance with principles of inventive concepts, a channel length of the second transistor design is smaller than of a channel length of the first transistor design.

In exemplary embodiments in accordance with principles of inventive concepts a drain-source voltage of the second transistor design is lower than a drain-source voltage of the first transistor design.

In exemplary embodiments in accordance with principles of inventive concepts, each of the first transistor design and the second transistor design includes an NMOS transistor design.

In exemplary embodiments in accordance with principles of inventive concepts, the first transistor design includes a first sub transistor design and a second sub transistor design connected in series; the first sub transistor design and the second sub transistor design are NMOS transistor designs; a drain of the second sub transistor is connected to a source of the first sub transistor; and the design module substitutes a single second transistor design for the first sub transistor design and the second sub transistor design, wherein a second drain-gate voltage of the second transistor design operating in the accumulation mode is higher than a third drain-gate voltage of the first sub transistor design and a fourth drain-gate voltage of the second sub transistor design, operating in the accumulation mode.

In exemplary embodiments in accordance with principles of inventive concepts, the circuit includes a level shift or an electrostatic discharge (ESD) protection circuit.

In exemplary embodiments in accordance with principles of inventive concepts, a circuit design method includes analyzing a semiconductor circuit design including a plurality of transistors and selecting a first NMOS transistor design from among the plurality of transistors within the circuit design, the first NMOS transistor operating in a region where a drain voltage is higher than a gate voltage; and substituting a second NMOS transistor having a smaller size than the first NMOS transistor for the first NMOS transistor in the semiconductor circuit, wherein the first NMOS transistor includes a gate insulating film without a high-k dielectric layer and the second NMOS transistor includes a gate insulating film with a high-k dielectric layer, and a second drain-gate voltage of the second NMOS transistor operating in an accumulation mode is higher than a first drain-gate voltage of the first NMOS transistor operating in the accumulation mode.

In exemplary embodiments in accordance with principles of inventive concepts, a thickness of the gate insulating film of the second NMOS transistor is smaller than a thickness of the gate insulating film of the first NMOS transistor.

In exemplary embodiments in accordance with principles of inventive concepts, wherein a channel length of the second NMOS transistor is smaller than of a channel length of the first NMOS transistor.

In exemplary embodiments in accordance with principles of inventive concepts, the first NMOS transistor includes a first sub NMOS transistor and a second sub NMOS transistor connected in series; the substituting of the second NMOS transistor for the first NMOS transistor comprises substituting a single second NMOS transistor for the first sub NMOS transistor and the second sub NMOS transistor; and a second drain-gate voltage of the second NMOS transistor operating in the accumulation mode is higher than a third drain-gate voltage of the first sub NMOS transistor and a fourth drain-gate voltage of the second sub NMOS transistor, operating in the accumulation mode.

In exemplary embodiments in accordance with principles of inventive concepts, a computer-readable recording medium includes a program for executing a circuit design method, the circuit design method circuit design method comprising analyzing a semiconductor circuit including a plurality of transistors and selecting a first NMOS transistor from among the plurality of transistors, the first NMOS transistor operating in a region where a drain voltage is higher than a gate voltage; and substituting a second NMOS transistor having a smaller size than the first NMOS transistor for the first NMOS transistor, wherein the first NMOS transistor includes a gate insulating film without a high-k dielectric layer and the second NMOS transistor includes a gate insulating film with a high-k dielectric layer, and a second drain-gate voltage of the second NMOS transistor operating in an accumulation mode is higher than a first drain-gate voltage of the first NMOS transistor operating in the accumulation mode.

In exemplary embodiments in accordance with principles of inventive concepts, a semiconductor circuit includes a first transistor gated to an inverted voltage level of a second node and supplying a power supply voltage to a first node; a second transistor connected in parallel to the first transistor, gated to an inverted voltage level of the first node and supplying the power supply voltage to the second node; a third transistor gated to a voltage level of an input signal and supplying a ground voltage; a fourth transistor connected in series to the third transistor, gated to the power supply voltage and transferring an output of the third transistor to the first node; a fifth transistor gated to an inverted voltage level of the input signal and supplying the ground voltage; and a sixth transistor connected in series to the fifth transistor, gated to the power supply voltage and transferring an output of the fifth transistor to the second node, wherein the first to sixth transistors include gate insulating films each including a high-k dielectric layer.

In exemplary embodiments in accordance with principles of inventive concepts, the third transistor is gated to the voltage level of the input signal and pulls down the first node, and the second transistor is gated to the voltage level of the first node and pulls up the second node.

In exemplary embodiments in accordance with principles of inventive concepts, drain-gate voltages of the third and fifth transistors operating in an accumulation mode are higher than drain-gate voltages of the fourth and sixth transistors operating in the accumulation mode.

In exemplary embodiments in accordance with principles of inventive concepts, thicknesses of the gate insulating films of the third and fifth transistors are smaller than thicknesses of the gate insulating films of the fourth and sixth transistors.

In exemplary embodiments in accordance with principles of inventive concepts, channel lengths of the third and fifth transistors are smaller than channel lengths of the fourth and sixth transistors.

In exemplary embodiments in accordance with principles of inventive concepts, a circuit design method includes analyzing a semiconductor circuit design including a plurality of MOS transistors and selecting a first transistor that operates within the circuit with its drain voltage higher than its gate voltage; and substituting in the circuit design a second, smaller transistor having a gate insulating film with a high-k dielectric layer, for the first transistor.

In exemplary embodiments in accordance with principles of inventive concepts, the first and second transistors are NMOS transistors.

In exemplary embodiments in accordance with principles of inventive concepts, the drain-gate voltage of the second transistor is higher than that of the first transistor when the transistors operate in an accumulation mode.

In exemplary embodiments in accordance with principles of inventive concepts, the second transistor has a thinner gate insulation layer than the first transistor.

In exemplary embodiments in accordance with principles of inventive concepts, the second transistor has a shorter channel length than the first transistor.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Figure 1:
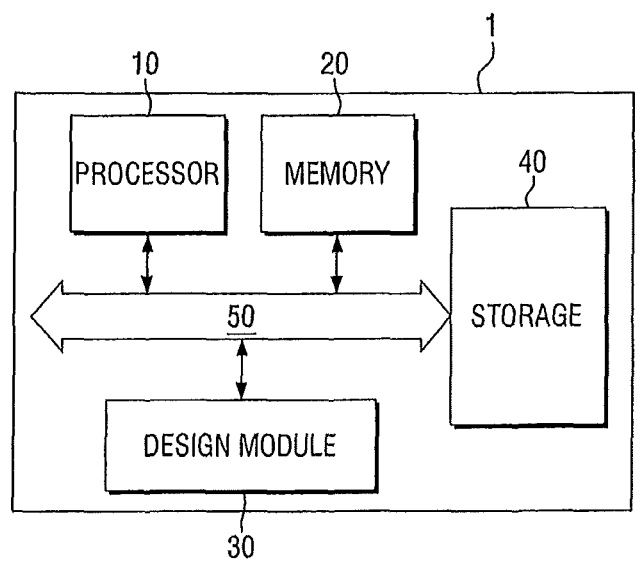
FIG. 1 is a schematic diagram for explaining a circuit design system according to an exemplary embodiment of inventive concepts.

Various exemplary embodiments will be described in detail with reference to the accompanying drawings. Inventive concepts, however, may be embodied in various different forms, and should not be construed as being limited only to the illustrated embodiments. Rather, these embodiments are provided as examples so that this disclosure will be thorough and complete, and will fully convey the concept of inventive concepts to those skilled in the art. Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, a circuit design system according to an exemplary embodiment of inventive concepts will be described with reference to FIG. 1.

FIG. 1 is a schematic diagram for illustrating an exemplary embodiment of a circuit design system in accordance with principles of inventive concepts.

The term "unit" or "module", as used herein, means, but is not limited to, a software or hardware component, such as field-programmable gate array (FPGA) or application-specific integrated circuit (ASIC), which performs certain tasks. However, the "unit" or "module" is not limited to software or hardware. A "unit" or "module" may advantageously be configured to reside on the addressable storage medium and configured to execute on one or more processors. Thus, a "unit" or "module" may include, by way of example, components, such as software components, object-oriented software components, class components and task components, processes, functions, attributes, procedures, subroutines, segments of program codes, drivers, firmware, microcode, circuitry, data, databases, data structures, tables, arrays, and variables. The functionality provided for in the components and "units" or "modules" may be combined into fewer components and "units" or "modules" or further separated into additional components and "units" or "modules".

In exemplary embodiments in accordance with principles of inventive concepts a system and method may determine the operating parameters, such as voltages, of MOS transistors within a circuit design by testing or simulation, for example. A system and method in accordance with principles of inventive concepts may identify a MOS transistor operating with its drain voltage higher than its gate voltage and substitute a smaller transistor for it in the circuit design. The smaller, substituted, transistor may be smaller in that it has a thinner gate insulation layer than the original transistor or in that it has a shorter channel length, for example, and it may include a high-k dielectric layer. Similarly, a single transistor having a high-k dielectric layer may be substituted for series-connected MOS to reduce the size of the circuit. In exemplary embodiments the drain-gate voltage, VDG, of the substituted transistor may be higher than that of the original transistor (that is, higher than that of the transistor which was swapped out of the design). The original transistor may be susceptible to reduced reliability when operating in the accumulation mode (i.e., off-state), but, because the substituted transistor includes a high-k dielectric layer, it can maintain reliability by its physical band-gap offset while sustaining a higher drain-gate voltage. As a result, a circuit implemented using a method and apparatus in accordance with principles of inventive concepts may provide improved reliability and reduced size.

Referring to FIG. 1, the circuit design system 1 according to an exemplary embodiment of inventive concepts includes a processor 10, a memory 20, a design module 30, a storage 40 and a bus 50.

The processor 10 may be used for performing an arithmetic computation of the design module 30, which will later be described in greater detail. In some embodiments of inventive concepts, the processor 10 may include at least one of a central processing unit (CPU) and a graphics processing unit (GPU). In addition, in FIG. 1, only one processor 10 is illustrated, but aspects of the present inventive concept are not limited thereto. In some embodiments of inventive concepts, a plurality of processors 10 may be provided. In other words, the illustrated circuit design system 1 may vary in many ways so long as it can be driven in a multi-core environment. In such a manner, if the circuit design system 1 is driven in a multi-core environment, computational efficiency can be improved.

Although not specifically shown, in order to improve computational capability, the processor 10 may further include cache memories L1, L2, etc. In some embodiments of inventive concepts, the processor 10 may be a semiconductor device, such as a field programmable gate array (FPGA), for example.

The memory 20 stores data required for the design module 30 to perform a circuit design operation using the processor 10. In some exemplary embodiments of inventive concepts, the memory 20 may load a plurality of transistor designs stored in the storage 40 to be described in greater detail later to supply the loaded transistor designs to the processor 10 or may store circuit designs designed by the processor 10 to then transfer the circuit designs to the storage 40.

In some exemplary embodiments of inventive concepts, the memory 20 may be a semiconductor memory including, for example, an arbitrary volatile memory, such as, a double data rate synchronous dynamic random access memory (DDR SDRAM), a single data rate synchronous dynamic random access memory (SDR SDRAM), a low power double data rate (LPDDR) SDRAM, or a direct rambus DRAM (RDRAM), but aspects of inventive concepts are not limited thereto.

The design module 30 designs a circuit using the processor 10 which employs the plurality of transistor designs stored in the storage 40 to be described later according to defined requirements.

First, the design module 30 analyzes a circuit design, including the plurality of transistor designs, and selects from among a plurality of transistor designs a first transistor design operating in a region where a drain voltage is higher than a gate voltage.

In detail, the design module 30 may receive a circuit design including the plurality of transistor designs stored in the storage 40 and may then identify operating voltages of the respective transistors of the circuit design. For example, in order to identify the operating voltages of the respective transistors, the design module may perform simulation on the circuit design in consideration of an input signal applied to the circuit design and control signals controlling the circuit design, thereby identifying the operating voltages of the respective transistors. After identifying the operating voltages of the respective transistors, the design module 30 selects the first transistor design operating in the region where a drain voltage is higher than a gate voltage. In some exemplary embodiments of inventive concepts, the first transistor design may include an NMOS transistor.

Next, the design module 30 substitutes a second transistor design for the selected first transistor design. In exemplary embodiments, the second transistor design has a smaller size than the first transistor design. The term "size" used herein may mean the overall size of a transistor device or may mean a thickness, breath or width of a particular region or feature size of the transistor device.

In detail, in some exemplary embodiments of inventive concepts, the second transistor design substituted for the first transistor design by the design module 30 may include a gate insulating film having a thickness smaller than that of a gate insulating film of the first transistor design. In some other exemplary embodiments of inventive concepts, the second transistor design substituted for the first transistor design by the design module 30 may have a channel length smaller than that of the first transistor design. In some other exemplary embodiments of inventive concepts, two first transistor designs may be selected by the design module 30 and one single second transistor design may be substituted for the selected two first transistor designs, for example.

In exemplary embodiments, a second drain-gate voltage $V_{DG}$ of the second transistor design operating in the accumulation mode is higher than a first drain-gate voltage $V_{DG}$ of the first transistor design operating in the accumulation mode.

Assume, for example, that a voltage applied to the gate insulating film of the first transistor design is 1 V and a voltage applied to a drain electrode of the first transistor design is 2 V. If the first transistor design operates in an inversion mode due to the voltage of 1 V applied to a gate electrode, the reliability of the first transistor design may not be compromised. However, if a gate-source voltage $V_{GS}$ of the first transistor design does not exceed a threshold voltage of the first transistor design so that the first transistor design operates in the accumulation mode, that is, in an off-state, the reliability of the first transistor design may be compromised. For example, if the voltage applied to the gate electrode of the first transistor design is 0 V, a drain-gate voltage $V_{DG}$ of the first transistor is 2 V, which, in this example, is beyond a voltage range within which the reliability of the first transistor design is maintained.

In various exemplary embodiments of inventive concepts, when the second transistor substituted by the design module 30 operates in the accumulation mode, the second transistor has a higher drain-gate voltage $V_{DG}$ than the first transistor. Because, in exemplary embodiments, the second transistor includes a high-k dielectric layer, it is necessary for the second transistor to maintain the reliability in the voltage of 1 V when the second transistor operates in the inversion mode. However, when the second transistor operates in the accumulation mode, it can maintain the reliability by a physical bandgap offset while having a drain-gate voltage $V_{DG}$ of 2 V. Additionally, since the second transistor has a smaller size than the first transistor, an area of the circuit design can be reduced while maintaining the reliability. As a result, the thus-designed circuit may have improved performance and can reduce power consumption.

Specific embodiments of substituting the second transistor design having a smaller size than the first transistor design selected by the design module 30 will later be described in detail with reference to FIGS. 3 to 7.

In some exemplary embodiments of inventive concepts, the design module 30 may be implemented in software, but aspects of inventive concepts are not limited thereto. In some exemplary embodiments of inventive concepts in which the design module 30 is implemented in software, it may be stored in the storage 40 in forms of codes or may be stored in another storage (not shown) separated from the storage 40 in forms of codes.

The storage 40 stores the plurality of transistor designs required for the design module 30 to perform a circuit design operation using the processor 10. In exemplary embodiments, the plurality of transistor designs stored in the storage 40 are designs of transistors including a high-k dielectric layer. That is, each of the plurality of transistor designs stored in the storage 40 may include a high-k dielectric layer in its gate insulating film.

In some exemplary embodiments of inventive concepts, the gate insulating film is formed on a substrate and may include an interface layer that prevents an interface failure between the substrate (e.g., a device isolation layer) and the gate insulating film and a high-k dielectric layer formed on the interface layer. In some exemplary embodiments of inventive concepts, the interface layer may include a low-k material layer having a dielectric constant (k) of 9 or less, such as a silicon oxide layer (k≈4) or a silicon oxynitride layer (k≈4~8 according to concentrations of oxygen and nitrogen atoms), for example. Alternatively, the interface layer may include silicate or a combination of layers listed above.

In some exemplary embodiments of inventive concepts, the high-k dielectric layer may include, for example, one selected from the group consisting of HfSiON, $HfO_2$, $ZrO_2$, $Ta_2O_5$, $TiO_2$, $SrTiO_3$, $BaTiO_3$, and $SrTiO_3$. In some exemplary embodiments of inventive concepts, the gate insulating film may be formed to an appropriate thickness according to the kind of device to be formed, which will later be described in detail with reference to FIG. 2.

In some exemplary embodiments of inventive concepts, the storage 40 may include, for example, a non-volatile memory device. Examples of the non-volatile memory device may include NAND flash, NOR flash, MRAM, PRAM, RRAM, and so on, but aspects of the present inventive concept are not limited thereto. In some other exemplary embodiments of inventive concepts, the storage 10 may include a hard disk drive (HDD), a solid state drive (SSD), an optical drive, such as CD-ROM or DVD-ROM, and a magnetic memory.

The processor 10, the memory 20, the design module 30 and the storage 40 may exchange data through the bus 50. In detail, exemplary embodiments of the bus 50 may include a multi-layer advanced high-performance bus (AHB) or a multi-layer advanced eXtensible interface (AXI), but aspects of the present inventive concept are not limited thereto.

Figure 2:
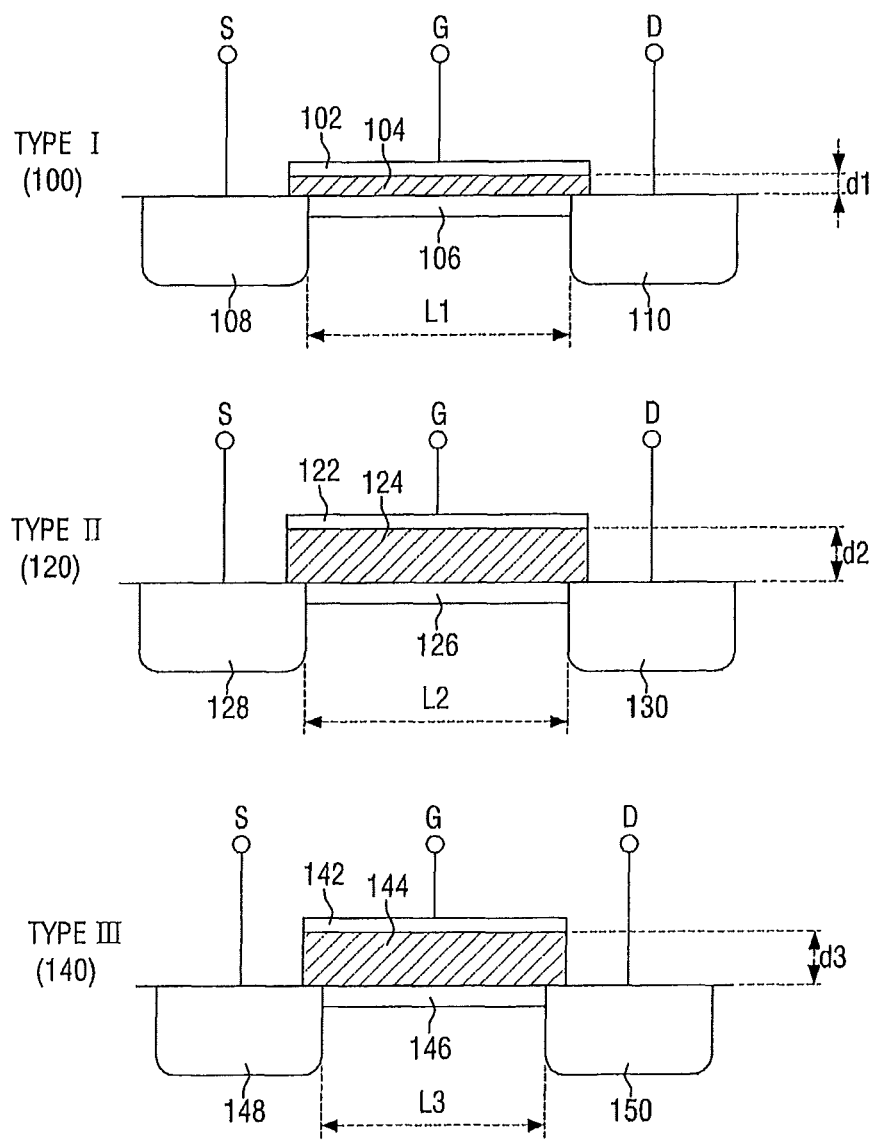
FIG. 2 is a schematic diagram for explaining three types of transistors used in the circuit design system shown in FIG. 1.

FIG. 2 is a schematic diagram for illustrating three types of transistors that may be used in exemplary embodiments of the circuit design system shown in FIG. 1.

In FIG. 2, exemplary embodiments of the first type transistor 100, the second type transistor 120 and the third type transistor 140 are illustrated. In the circuit design system 1 according to an exemplary embodiment of inventive concepts, the storage 40 may store transistor designs for the first type transistor 100, the second type transistor 120 and the third type transistor 140, and the design module 30 may design a circuit by the processor 10 using three types of transistor designs pre-stored in the storage 40.

The first type transistor 100 includes a gate electrode 102, a source region 108 and a drain region 110 formed on the substrate, and a gate insulating film 104 formed between the substrate and the gate electrode 102. If the first type transistor 100 is turned on, a channel 106 is formed between the source region 108 and the drain region 110. The configuration of the thus formed transistor is also applied to the second type transistor 120 and the third type transistor 140, and repeated descriptions thereof will not be given.

The second type transistor 120 includes a gate insulating film 124 formed between the substrate and the gate electrode 122. A thickness d2 of the gate insulating film 124 of the second type transistor 120 is greater than a thickness d1 of the gate insulating film 104 of the first type transistor 100. Accordingly, the second type transistor 120 including the gate insulating film 124 thicker than the gate insulating film 104 of the first type transistor 100 may occupy a larger area, or volume, or, generally, size than the first type transistor. The second type transistor 120 including the gate insulating film 124 thicker than the gate insulating film 104 of the first type transistor 100 may have a higher threshold voltage than the first type transistor 100.

The third type transistor 140 may include a channel 146 formed between a source region 148 and a drain region 150. A thickness d3 of a gate insulating film 144 of the third type transistor 140 is greater than the thickness d1 of the gate insulating film 104 of the first type transistor 100, and a length L3 of the channel 146 of the third type transistor 140 is smaller than a length L2 of the channel 126 of the second type transistor 120. Accordingly, the third type transistor 140 having the channel 146 shorter than the channel 126 of the second type transistor 120 may occupy a smaller area (or size) than the second type transistor 120. The third type transistor 140 having the channel 146 shorter than the channel 126 of the second type transistor 120 has a lower drain-source voltage $V_{DS}$ than the second type transistor 120.

In one exemplary embodiment of inventive concepts, the first type transistor 100 may include a single gate (SG) transistor, the second type transistor 120 may include an enhanced gate (EG) transistor including a gate insulating film thicker than that of the SG transistor, and the third type transistor 140 may include a gate insulating film thicker than that of the SG transistor and an EGV transistor having a smaller channel length than the EG transistor, but aspects of the present inventive concept are not limited thereto.

Hereinafter, various exemplary embodiments for designing a circuit using the three types of transistor designs stored in the storage 40 of the circuit design system 1 according to an exemplary embodiment of inventive concepts will be described with reference to FIGS. 3 to 7.

Figure 3:
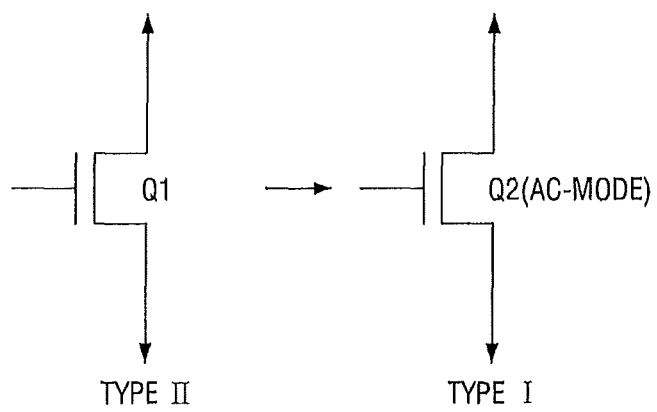
FIG. 3 is a schematic diagram for explaining an exemplary circuit design using the circuit design system shown in FIG. 1.

FIG. 3 is a schematic diagram for explaining an exemplary circuit design using the circuit design system shown in FIG. 1.

Referring to FIG. 3, the design module 30 of the circuit design system 1 according to an exemplary embodiment of inventive concepts analyzes a circuit design including a plurality of transistor designs and selects a second type transistor design Q1 operating in a region where a drain voltage is higher than a gate voltage.

Next, the design module 30 of the circuit design system 1 looks up the plurality of circuit designs stored in the storage 40 and fetches a transistor design for a first type transistor design Q2 having a smaller size than the second type transistor design Q1. The design module 30 of the circuit design system 1 may substitute the first type transistor design Q2 fetched from the storage 40 for the second type transistor design Q1 selected from the circuit design.

In exemplary embodiments, the first type transistor design Q2 is a transistor design including a high-k dielectric layer and having a gate insulating film thicker than that of the second type transistor design Q1. The first type transistor design Q2 has a smaller area or size than the second type transistor design Q1 and has a lower threshold voltage than the second type transistor design Q1.

In exemplary embodiments, a drain-gate voltage $V_{DG}$ of the first type transistor design Q2 operating in an accumulation mode (AC-mode) is higher than that of the second type transistor design Q1 operating in the accumulation mode.

As described above, the second type transistor design Q1 operating in a region where a drain voltage is lower than a gate voltage is substituted by the first type transistor design Q2 including a gate insulating film including a high-k dielectric layer that is smaller than the second type transistor design Q1 and, as a result, the area required for the circuit design may be reduced while maintaining the reliability of the circuit.

Figure 4:
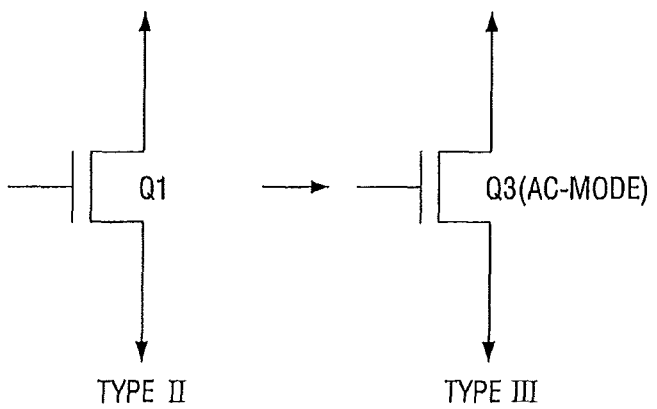
FIG. 4 is a schematic diagram for explaining another exemplary circuit design using the circuit design system shown in FIG. 1.

FIG. 4 is a schematic diagram for illustrating another exemplary circuit design using the circuit design system shown in FIG. 1.

Referring to FIG. 4, the circuit design system 1 according to an exemplary embodiment of inventive concepts analyzes a circuit design including the plurality of transistor designs and then selects a second type transistor design Q1 operating in a region where a drain voltage is higher than a gate voltage.

Next, the design module 30 of the circuit design system 1 looks up the plurality of circuit designs stored in the storage 40 and fetches a transistor design for the third type transistor design Q3 having a smaller size than the first type transistor design Q2. The design module 30 of the circuit design system 1 may substitute the third type transistor design Q3 fetched from the storage 40 for the second type transistor design Q1 selected by the circuit design.

In exemplary embodiments, the third type transistor design Q3 is a transistor design including a high-k dielectric layer and its channel is shorter than that of the second type transistor design Q1. A drain-source voltage $V_{DS}$ of the third type transistor design Q3 is lower than that of the second type transistor design Q1.

In exemplary embodiments, the drain-gate voltage $V_{DG}$ of the third type transistor design Q3 operating in an accumulation mode is higher than that of the second type transistor design Q1 operating in the accumulation mode.

As described above, in exemplary embodiments in accordance with principles of inventive concepts, second type transistor design Q1 operating in a region where a drain voltage is lower than a gate voltage is substituted by the third type transistor design Q3, which includes a gate insulating film including a high-k dielectric layer and is smaller than the second type transistor design Q1, thereby reducing an area of the circuit design while maintaining the reliability.

Figure 5:
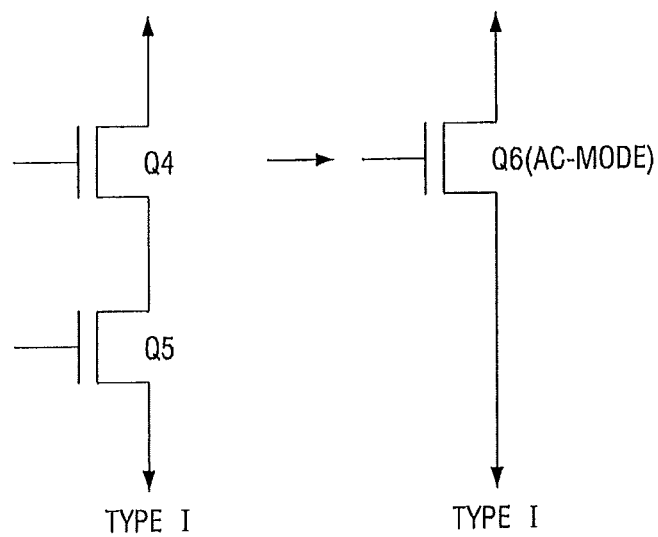
FIG. 5 is a schematic diagram for explaining still another exemplary circuit design using the circuit design system shown in FIG. 1.

FIG. 5 is a schematic diagram for illustrating another exemplary circuit design using the circuit design system shown in FIG. 1.

Referring to FIG. 5, the circuit design system 1 according to an exemplary embodiment of inventive concepts analyzes a circuit design including a plurality of transistor designs and selects a transistor including two sub transistor designs Q4 and Q5 operating in a region where a drain voltage is higher than a gate voltage. In this exemplary embodiment, the two sub transistor designs Q4 and Q5 may be connected in series to each other. For example, the two sub transistor designs Q4 and Q5 may be NMOS transistors, and a drain of the sub transistor design Q5 may be connected to a source of the sub transistor design Q4. The design module 30 of the circuit design system 1 looks up the plurality of circuit designs stored in the storage 40 and fetches a transistor design Q6 of the same type as the two sub transistor designs Q4 and Q5. The design module 30 of the circuit design system 1 may substitute one single transistor design Q6 for the two sub transistor designs Q4 and Q5 connected in series. In exemplary embodiments, a drain voltage of the substituted transistor design Q6 may be the same as that of the sub transistor design Q4.

In exemplary embodiments, a drain-gate voltage $V_{DG}$ of the transistor design Q6 operating in an accumulation mode is higher than that of each of the sub transistor designs Q4 and Q5 operating in the accumulation mode.

As described above, the two sub transistor designs Q4 and Q5 connected in series are substituted by the transistor design Q6, which includes a gate insulating film employing a high-k dielectric layer and having the same type as the two sub transistor designs Q4 and Q5, thereby reducing an area of the circuit design while maintaining the reliability.

Figure 6:
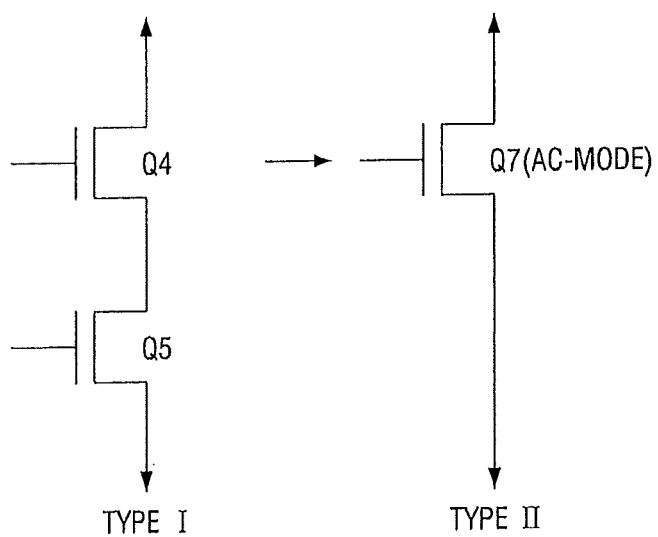
FIG. 6 is a schematic diagram for explaining still another exemplary circuit design using the circuit design system shown in FIG. 1.

FIG. 6 is a schematic diagram for illustrating another exemplary circuit design using the circuit design system shown in FIG. 1.

Referring to FIG. 6, circuit design system 1 according to an exemplary embodiment of inventive concepts analyzes a circuit design including the plurality of transistor designs and then selects a transistor including two sub transistor designs Q4 and Q5 operating in a region where a drain voltage is higher than a gate voltage. In this exemplary embodiment, the two sub transistor designs Q4 and Q5 may be connected in series. For example, the two sub transistor designs Q4 and Q5 may be NMOS transistors, and a drain of the sub transistor design Q5 may be connected to a source of the sub transistor design Q4. The design module 30 of the circuit design system 1 looks up the plurality of circuit designs stored in the storage 40 and fetches a transistor design Q7 of a different type from the two sub transistor designs Q4 and Q5. In exemplary embodiments, the transistor design Q7 may include a gate insulating film thicker than that of each of the two sub transistor designs Q4 and Q5. The design module 30 of the circuit design system 1 may substitute one single transistor design Q7 for the two sub transistor designs Q4 and Q5 connected in series, selected by the circuit design. In exemplary embodiments, a drain voltage of the substituted transistor design Q7 may be the same as that of the sub transistor design Q4.

In exemplary embodiments, the transistor design Q7 is a transistor design including a high-k dielectric layer and a thickness of a gate insulating film of the transistor design Q7 may be greater than that of each of the two sub transistor designs Q4 and Q5. In exemplary embodiments in accordance with principles of inventive concepts, even if the thickness of the gate insulating film is increased (with that of Q7 greater than that of Q4 and Q5, for example), an increased amount of the thickness of the gate insulating film is smaller than a decreased amount of the size of one single transistor design Q7 substituted for the two sub transistor designs Q4 and Q5. Accordingly, the transistor design Q7 has a smaller size than the two sub transistor designs Q4 and Q5.

In exemplary embodiments, a drain-gate voltage $V_{DG}$ of the transistor design Q7 operating in an accumulation mode is higher than that of each of the sub transistor designs Q4 and Q5 operating in the accumulation mode.

As described above, the two sub transistor designs Q4 and Q5 connected in series are substituted by the transistor design Q7 including a gate insulating film including a high-k dielectric layer and having a different type from the two sub transistor designs Q4 and Q5, thereby reducing an area of the circuit design while maintaining the reliability.

In some exemplary embodiments of inventive concepts, the aforementioned transistor designs may include NMOS transistor designs, but aspects of the present inventive concept are not limited thereto. In exemplary embodiments of inventive concepts, the circuit designed by the circuit design system 1 may include a level shift or an electrostatic discharge (ESD) protection circuit, but aspects of inventive concepts are not limited thereto.

Figure 7:
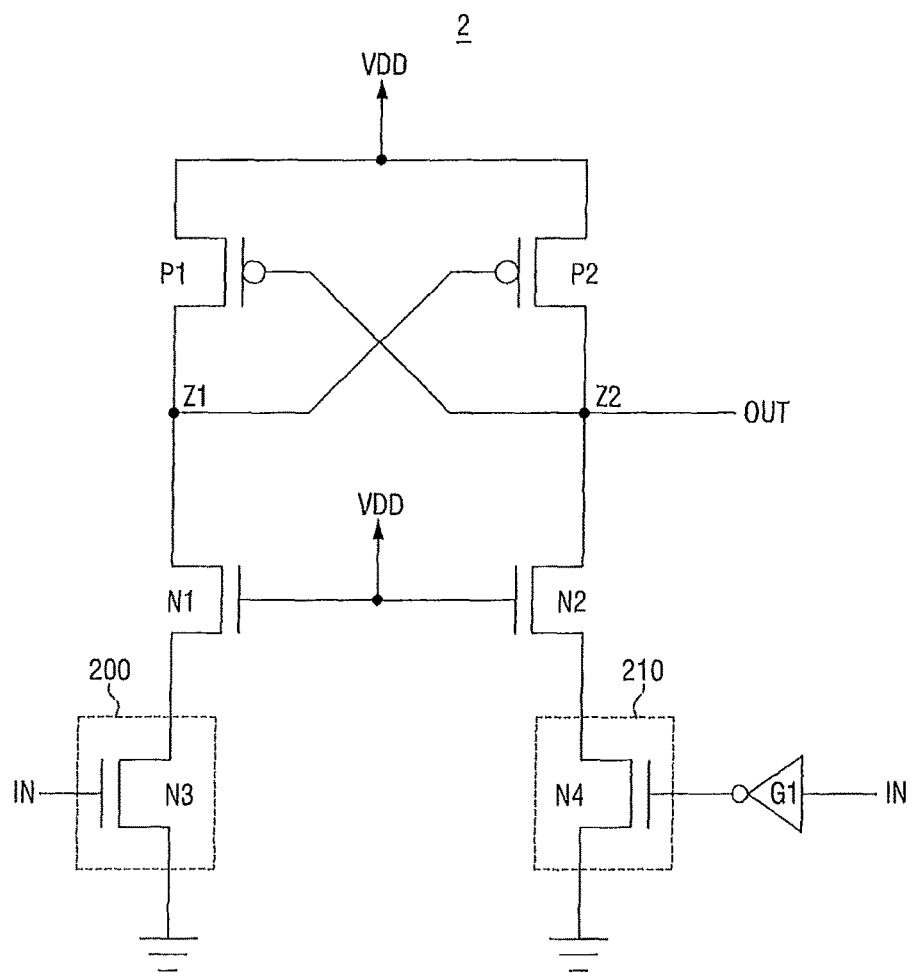
FIG. 7 is a schematic diagram for explaining an exemplary semiconductor circuit designed using the circuit design system shown in FIG. 1.

FIG. 7 is a schematic diagram for illustrating an exemplary semiconductor circuit designed using the circuit design system shown in FIG. 1.

Referring to FIG. 7, the semiconductor circuit 2 designed using the circuit design system according to an exemplary embodiment of inventive concepts includes transistors P1, P2, N1, N2, N3, and N4. In exemplary embodiments, each of the transistors P1, P2, N1, N2, N3, and N4 may include a gate insulating film including a high-k dielectric layer.

The first transistor P1 is gated to a voltage level of a second node Z2 and supplies a power supply voltage VDD to a first node Z1, and the second transistor P2 is connected in parallel to the first transistor P1 and is gated to a voltage level of the first node Z1, and supplies the power supply voltage VDD to the second node Z2.

The third transistor N3 is gated to a voltage level of an input signal IN and supplies a ground voltage, and the fourth transistor N1 is connected in series to the third transistor N3 and is gated to the power supply voltage VDD, and transfers an output of the third transistor N3 to the first node Z1.

The fifth transistor N4 is gated to an inverted voltage level of the input signal IN and supplies the ground voltage, and the sixth transistor N2 is connected in series to the fifth transistor N4 and is gated to the power supply voltage VDD, and transfers an output of the fifth transistor N4 to the second node Z2.

In some exemplary embodiments of inventive concepts, a drain-gate voltage $V_{DG}$ of each of the third and fifth transistors N3 and N4 operating in an accumulation mode may be higher than that of each of the fourth and sixth transistors N1 and N2 operating in the accumulation mode.

In some exemplary embodiments of inventive concepts, thicknesses of gate insulating films of the third and fifth transistors N3 and N4 may be less than the thicknesses of gate insulating films of the fourth and sixth transistors N1 and N2.

In some exemplary embodiments of inventive concepts, channel lengths of the third and fifth transistors N3 and N4 may be less than the channel lengths of the fourth and sixth transistors N1 and N2.

Figure 8:
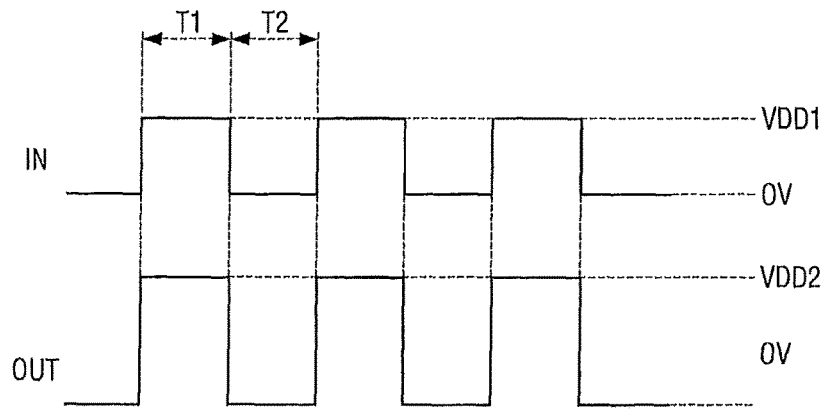
FIG. 8 is a timing diagram illustrating an operation of the semiconductor circuit shown in FIG. 7.

FIG. 8 is a timing diagram illustrating an operation of the semiconductor circuit shown in FIG. 7.

Referring to FIG. 8 together with FIG. 7, the third transistor N3 may be gated to the voltage level of the input signal IN and may pull down the first node Z1, and the second transistor P2 may be gated to the voltage level of the first node Z1 and may pull up the second node Z2.

In detail, as in a period T1 of FIG. 8, in which the voltage level of the input signal IN is "HIGH", the third transistor N3 gated to the voltage level of the input signal IN and the fourth transistor N1 gated by the power supply voltage VDD are turned on. Accordingly, the voltage level of the first node Z1 becomes "LOW", and the second transistor P2 gated to the voltage of the first node Z1 is turned on to supply the power supply voltage VDD to an output OUT.

Assuming that a voltage of a level "HIGH" of the input signal IN is VDD1 and a power supply voltage connected to the source of the second transistor P2 is VDD2, the "HIGH" voltage level of the input signal IN, which is input as the VDD1 level in the period T1 of FIG. 8, is level-shifted to have the voltage level VDD2.

Similarly, the fifth transistor N4 may be gated to the inverted voltage level of the input signal IN and may pull down the second node Z2, and the first transistor P1 may be gated to the voltage level of the second node Z2 and may pull up the first node Z1.

In detail, as in a period T2 of FIG. 8, in which the voltage level of the input signal IN is "LOW", the fifth transistor N4 gated to the inverted voltage level of the input signal IN and the sixth transistor N2 gated by the power supply voltage VDD are turned on. Accordingly, the voltage level of the second node Z2 becomes "LOW", and the first transistor P1 gated to the voltage of the second node Z2 is turned on to supply the power supply voltage VDD to the first node Z1. Therefore, the voltage level in the period T2 of FIG. 8 becomes "LOW", e.g., 0 V.

Figure 9:
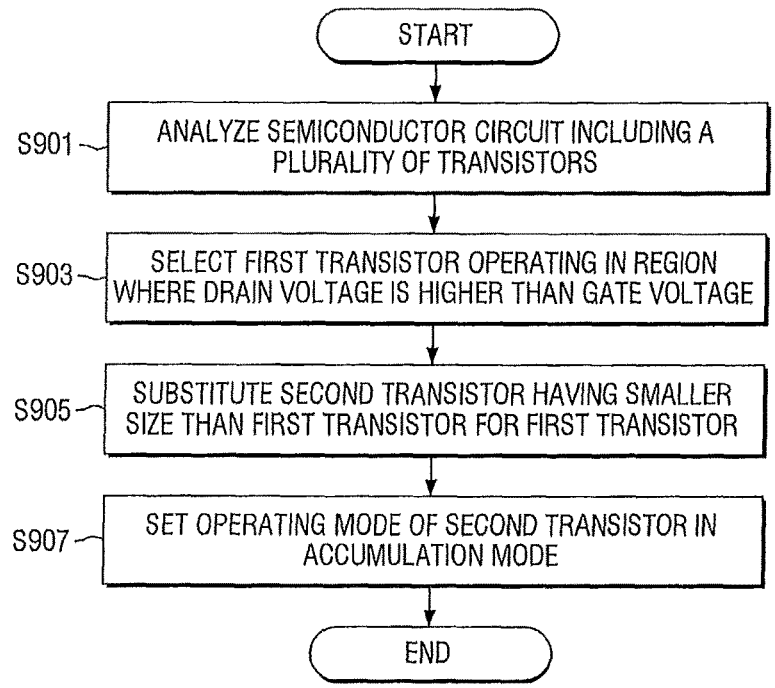
FIG. 9 is a flowchart illustrating a circuit design method according to an exemplary embodiment of inventive concepts.

FIG. 9 is a flowchart illustrating a circuit design method according to an exemplary embodiment of inventive concepts.

Referring to FIG. 9, the circuit design method according to an exemplary embodiment of inventive concepts includes analyzing a semiconductor circuit including a plurality of transistors (S901), selecting a first transistor operating in a region where a drain voltage is higher than a gate voltage from among the plurality of transistors (S903), and substituting a second transistor having a smaller size than the first transistor for the selected first transistor (S905), and setting operating mode of the second transistor in accumulation mode (S907). In exemplary embodiments, the second transistor includes a gate insulating film including a high-k dielectric layer.

In some exemplary embodiments of inventive concepts, a thickness of the gate insulating film of the second transistor may be less than the thickness of the gate insulating film of the first transistor. In some exemplary embodiments of inventive concepts, a channel length of the second transistor design may be shorter than the channel length of the first transistor design.

In exemplary embodiments, a second drain-gate voltage of the second transistor design operating in an accumulation mode is higher than a first drain-gate voltage of the first transistor design operating in the accumulation mode.

Figure 10:
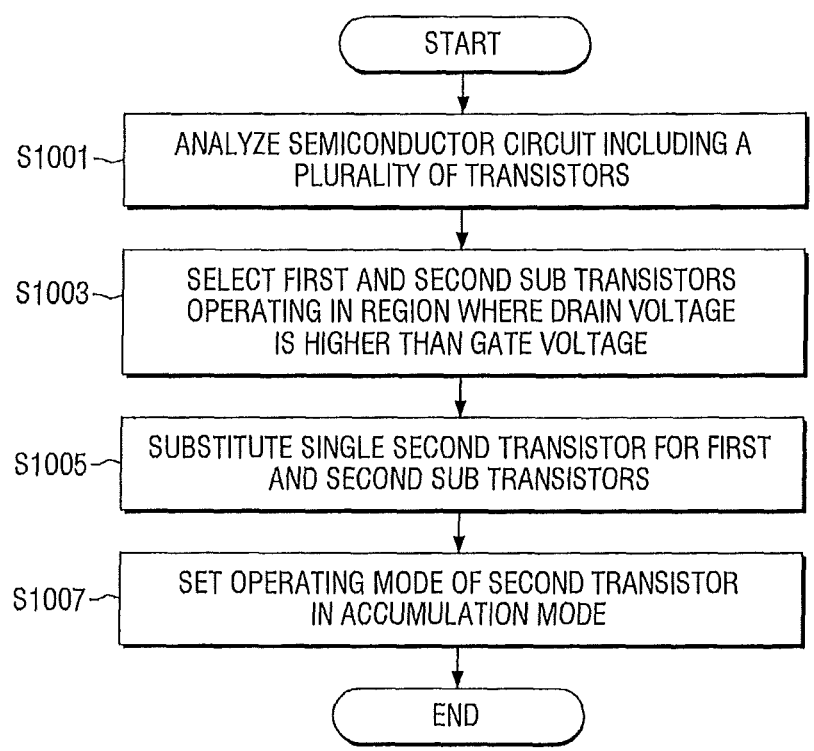
FIG. 10 is a flowchart illustrating a circuit design method according to another exemplary embodiment of inventive concepts.

FIG. 10 is a flowchart illustrating a circuit design method according to another exemplary embodiment of inventive concepts.

Referring to FIG. 10, the circuit design method according to another exemplary embodiment of inventive concepts includes analyzing a semiconductor circuit including a plurality of transistors (S1001), selecting a first transistor including a first sub transistor and a second sub transistor connected in series, the first transistor operating in a region where a drain voltage is higher than a gate voltage, from among the plurality of transistors (S1003), and substituting a single second transistor for the first sub transistor and the second sub transistor (S1005), and setting operating mode of the second transistor in accumulation mode (S1007). In exemplary embodiments the second transistor includes a gate insulating film including a high-k dielectric layer.

In some exemplary embodiments of inventive concepts, the first and second sub transistors and the second transistor may be transistors having the same type. In some exemplary embodiments of inventive concepts, the second transistor may be a transistor including a thicker gate insulating film than the first sub transistor and the second sub transistor.

In exemplary embodiments, a second drain-gate voltage of the second transistor design operating in an accumulation mode may be higher than a third drain-gate voltage of the first sub transistor design and a fourth drain-gate voltage of the second sub transistor design, operating in the accumulation mode.

In some exemplary embodiments of inventive concepts, computer-readable recording medium may include a program for executing the circuit design methods shown in FIGS. 9 and 10. In some exemplary embodiments of inventive concepts, the computer-readable recording medium may correspond to the storage 40 of the circuit design system 1, and the program may be executed on the processor 10 of the circuit design system 1.

Next, an electronic system including semiconductor circuits according to some exemplary embodiments of inventive concepts will be described with reference to FIG. 11.

Figure 11:
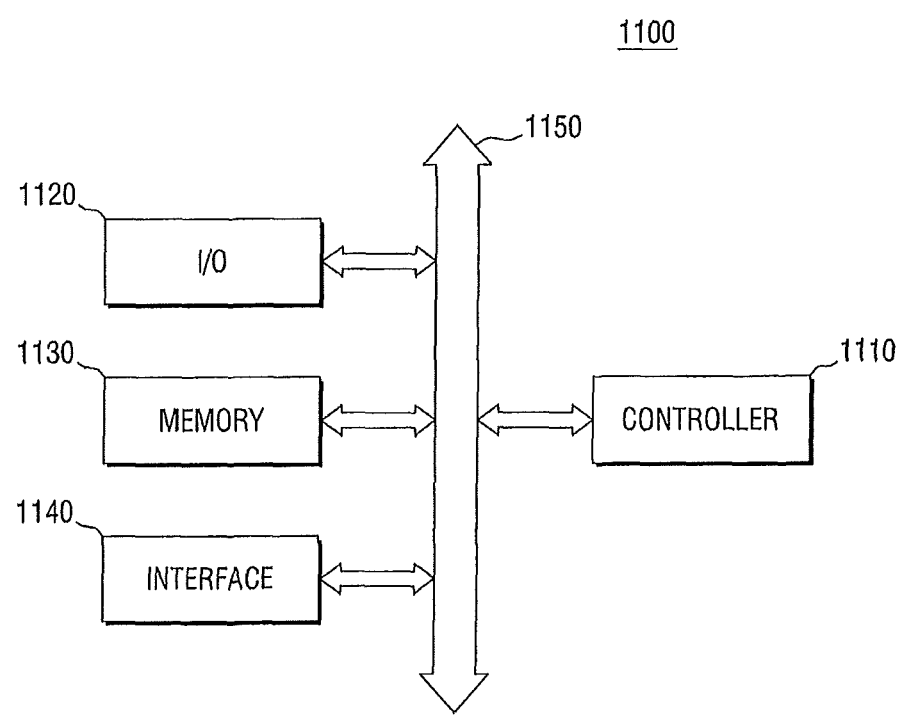
FIG. 11 is a block diagram of an electronic system including semiconductor circuits according to some exemplary embodiments of inventive concepts.

FIG. 11 is a block diagram of an electronic system including semiconductor circuits according to some exemplary embodiments of inventive concepts.

Referring to FIG. 11, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not illustrated, the electronic system 1100 may further include high-speed DRAM and/or SRAM as the working memory for improving the operation of the controller 1110. In exemplary embodiments, a semiconductor device according to the exemplary embodiment of inventive concepts may be employed as the working memory. In addition, a semiconductor circuit according to the exemplary embodiment of inventive concepts may be provided in the memory device 1130 or may be provided some components of the controller 1110 or the I/O 1120, for example.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment, for example.

Figure 12:
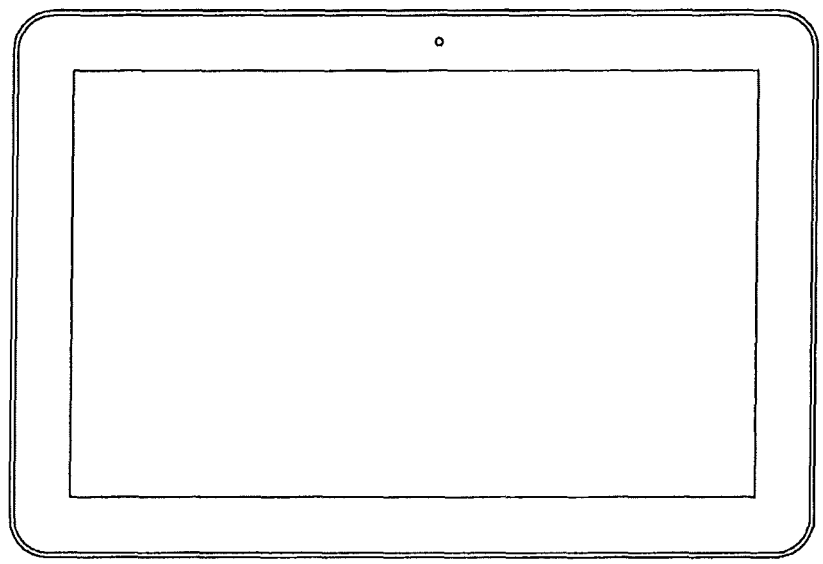
FIGS. 12 to 14 illustrate exemplary semiconductor systems to which semiconductor devices according to some exemplary embodiments of inventive concepts can be applied.
Figure 13:
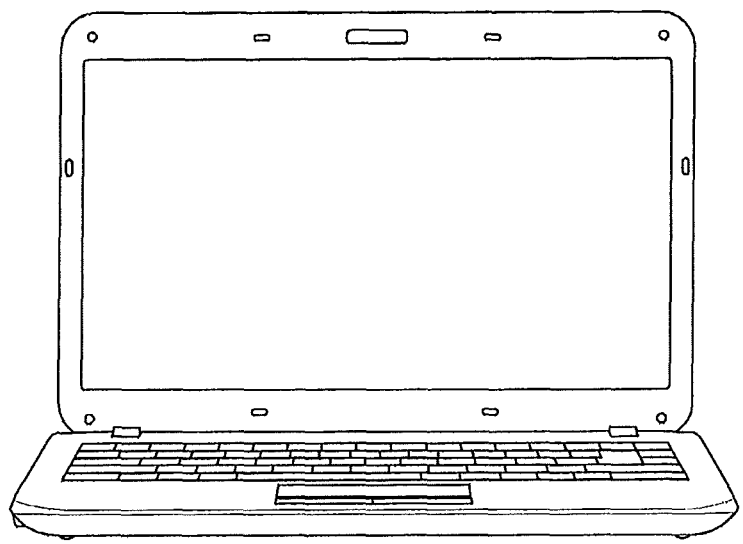
Figure 14:
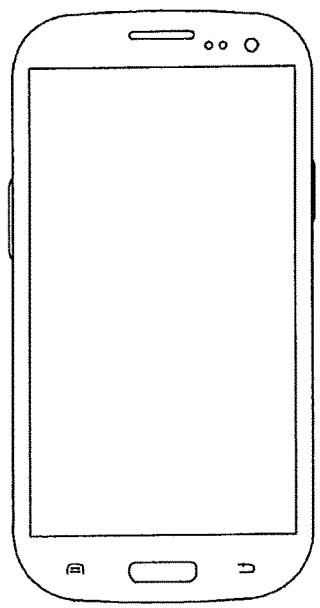

FIGS. 12 to 14 illustrate exemplary semiconductor systems to which semiconductor devices according to some exemplary embodiments of inventive concepts may be applied.

FIG. 12 illustrates an example in which a semiconductor device according to an exemplary embodiment of inventive concepts is applied to a tablet PC (1200), FIG. 13 illustrates an example in which a semiconductor device according to an exemplary embodiment of inventive concepts is applied to a notebook computer (1300), and FIG. 14 illustrates an example in which a semiconductor device according to an exemplary embodiment of inventive concepts is applied to a smart phone (1400). At least one of the semiconductor circuits according to some exemplary embodiments of inventive concepts can be employed to a tablet PC 1200, a notebook computer 1300, a smart phone 1400, and the like.

Semiconductor circuits according to some exemplary embodiments of inventive concepts may also be applied to other IC devices not illustrated herein. That is to say, in the above-described embodiments, only the tablet PC 1200, the notebook computer 1300 and the smart phone 1400 have been exemplified as the semiconductor systems according to the exemplary embodiments of inventive concepts, but aspects of the present inventive concept are not limited thereto.

In some exemplary embodiments of inventive concepts, the semiconductor system may be implemented as a computer, an ultra mobile personal computer (UMPC), a work station, a net-book, a personal digital assistant (PDA), a portable computer, a web tablet, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While inventive concepts have been particularly shown and described with reference to exemplary embodiments thereof, it will be understood by those of ordinary skill in the art that various changes in form and details may be made therein without departing from the spirit and scope of inventive concepts as defined by the following claims. It is therefore desired that the present embodiments be considered in all respects as illustrative and not restrictive, reference being made to the appended claims rather than the foregoing description to indicate the scope of inventive concepts.

What is claimed is:

1. A circuit design system comprising:
a processor;
a storage in which a plurality of transistor designs are stored; and
a design module designing a circuit based on the plurality of transistor designs according to defined requirements by the processor,
wherein the plurality of transistor designs are designs for transistors each including a gate insulating film with a high-k dielectric layer, and comprising first and second transistor designs,
wherein the design module analyzes the plurality of transistor designs stored in the storage, selects the first transistor design whereby the first transistor design operates within the circuit in a region where a drain voltage is higher than a gate voltage, substitutes the second transistor design having a smaller size than the first transistor design for the selected first transistor design, and causes manufacture of the circuit, wherein a second drain-gate voltage of the second transistor design operating in an accumulation mode is higher than a first drain-gate voltage of the first transistor design operating in the accumulation mode.

2. The circuit design system of claim 1, wherein the second drain-gate voltage of the second transistor design is higher than the first drain-gate voltage of the first transistor design in the accumulation mode.

3. The circuit design system of claim 1, wherein an area of the second transistor design is smaller than an area of the first transistor design.

4. The circuit design system of claim 1, wherein a thickness of the gate insulating film of the second transistor design is smaller than a thickness of the gate insulating film of the first transistor design.

5. The circuit design system of claim 4, wherein a threshold voltage of the second transistor design is lower than a threshold voltage of the first transistor design.

6. The circuit design system of claim 1, wherein a channel length of the second transistor design is smaller than of a channel length of the first transistor design.

7. The circuit design system of claim 6, wherein a drain-source voltage of the second transistor design is lower than a drain-source voltage of the first transistor design.

8. The circuit design system of claim 1, wherein each of the first transistor design and the second transistor design includes an NMOS transistor design.

9. The circuit design system of claim 1, wherein the first transistor design includes a first sub transistor design and a second sub transistor design connected in series; the first sub transistor design and the second sub transistor design are NMOS transistor designs; a drain of the second sub transistor is connected to a source of the first sub transistor; and the design module substitutes a single second transistor design for the first sub transistor design and the second sub transistor design, wherein a second drain-gate voltage of the second transistor design operating in the accumulation mode is higher than a third drain-gate voltage of the first sub transistor design and a fourth drain-gate voltage of the second sub transistor design, operating in the accumulation mode.

10. The circuit design system of claim 1, wherein the circuit includes a level shift or an electrostatic discharge (ESD) protection circuit.

11. A circuit design method comprising:
analyzing a semiconductor circuit design including a plurality of transistors and selecting a first NMOS transistor design from among the plurality of transistors within the semiconductor circuit design stored in a storage, the first NMOS transistor operating in a region where a drain voltage is higher than a gate voltage; and
substituting a second NMOS transistor having a smaller size than the first NMOS transistor for the first NMOS transistor in the semiconductor circuit and causing manufacture of the circuit design,
wherein the first NMOS transistor includes a gate insulating film without a high-k dielectric layer and the second NMOS transistor includes a gate insulating film with a high-k dielectric layer, and a second drain-gate voltage of the second NMOS transistor operating in an accumulation mode is higher than a first drain-gate voltage of the first NMOS transistor operating in the accumulation mode.

12. The circuit design method of claim 11, wherein a thickness of the gate insulating film of the second NMOS transistor is smaller than a thickness of the gate insulating film of the first NMOS transistor.

13. The circuit design method of claim 11, wherein a channel length of the second NMOS transistor is smaller than of a channel length of the first NMOS transistor.

14. The circuit design method of claim 11, wherein the first NMOS transistor includes a first sub NMOS transistor and a second sub NMOS transistor connected in series; the substituting of the second NMOS transistor for the first NMOS transistor comprises substituting a single second NMOS transistor for the first sub NMOS transistor and the second sub NMOS transistor; and a second drain-gate voltage of the second NMOS transistor operating in the accumulation mode is higher than a third drain-gate voltage of the first sub NMOS transistor and a fourth drain-gate voltage of the second sub NMOS transistor, operating in the accumulation mode.

15. A non-transitory computer-readable recording medium including a program for executing a circuit design method, the circuit design method comprising:
 analyzing a semiconductor circuit including a plurality of transistors and selecting a first NMOS transistor from among the plurality of transistors, the first NMOS transistor operating in a region where a drain voltage is higher than a gate voltage; and
 substituting a second NMOS transistor having a smaller size than the first NMOS transistor for the first NMOS transistor and causing manufacture of the semiconductor circuit,
 wherein the first NMOS transistor includes a gate insulating film without a high-k dielectric layer and the second NMOS transistor includes a gate insulating film with a high-k dielectric layer, and a second drain-gate voltage of the second NMOS transistor operating in an accumulation mode is higher than a first drain-gate voltage of the first NMOS transistor operating in the accumulation mode.

16. A circuit design method comprising:
 analyzing a semiconductor circuit design including a plurality of MOS transistors and selecting a first transistor that operates within a circuit with its drain voltage higher than its gate voltage; and
 substituting in the circuit design a second, smaller transistor having a gate insulating film with a high-k dielectric layer, for the first transistor and causing manufacture of the circuit design.

17. The circuit design method of claim 16, wherein the first and second transistors are NMOS transistors.

18. The circuit design method of claim 16, wherein a drain-gate voltage of the second transistor is higher than that of the first transistor when the transistors operate in an accumulation mode.

19. The circuit design method of claim 16, wherein the second transistor has a thinner gate insulation layer than the first transistor.

20. The circuit design method of claim 16, wherein the second transistor has a shorter channel length than the first transistor.

* * * * *